US009936604B2

(12) United States Patent
Tomoda et al.

(10) Patent No.: US 9,936,604 B2
(45) Date of Patent: Apr. 3, 2018

(54) OPTIONAL DEVICE FOR ELECTRICAL APPLIANCE

(71) Applicant: Konica Minolta, Inc., Chiyoda-ku, Tokyo (JP)

(72) Inventors: Yasuaki Tomoda, Toyohashi (JP); Shogo Asaoka, Toyokawa (JP); Naoki Matsui, Toyohashi (JP); Isao Kawakami, Gamagori (JP); Shuan Yang, Kariya (JP)

(73) Assignee: KONICA MINOLTA, INC., Chiyoda-Ku, Tokyo (JP)

( * ) Notice: Subject to any disclaimer, the term of this patent is extended or adjusted under 35 U.S.C. 154(b) by 73 days.

(21) Appl. No.: 15/078,204

(22) Filed: Mar. 23, 2016

(65) Prior Publication Data

US 2016/0286668 A1 Sep. 29, 2016

(30) Foreign Application Priority Data

Mar. 25, 2015 (JP) ................................ 2015-063279

(51) Int. Cl.

| | |
|---|---|
| ***G03G 21/00*** | (2006.01) |
| ***B41J 29/00*** | (2006.01) |
| ***H05H 1/24*** | (2006.01) |
| ***G03G 21/20*** | (2006.01) |
| ***G03G 15/20*** | (2006.01) |
| ***H05K 7/20*** | (2006.01) |

(52) U.S. Cl.

CPC ..... *H05K 7/20181* (2013.01); *B01D 2279/45* (2013.01)

(58) Field of Classification Search

CPC ........ G03G 21/00; G03G 21/20; G03G 15/20; B41J 29/00; H05H 1/24

USPC ............................ 55/385.1, 385.6, 470–473

See application file for complete search history.

(56) References Cited

FOREIGN PATENT DOCUMENTS

| | | |
|---|---|---|
| JP | H10-161510 A | 6/1998 |
| JP | 2007-019236 A | 1/2007 |
| JP | 2010-230430 A | 10/2010 |
| JP | 2011-081059 A | 4/2011 |
| JP | 2011-180235 A | 9/2011 |
| JP | 2012-133208 A | 7/2012 |
| JP | 2013-104656 A | 5/2013 |
| JP | 2013-148229 A | 8/2013 |
| JP | 2013-190762 A | 9/2013 |

OTHER PUBLICATIONS

Office Action (Notification of Reasons for Refusal) dated Mar. 28, 2017, by the Japanese Patent Office in corresponding Japanese Patent Application No. 2015-063279 and English translation of the Office Action. (14 pages).

*Primary Examiner* — Frank Lawrence, Jr.
*Assistant Examiner* — Minh-Chau Pham
(74) *Attorney, Agent, or Firm* — Buchanan Ingersoll & Rooney PC

(57) ABSTRACT

An option device for an electrical appliance of the invention is provided with a filter for purifying exhaust air from the electrical appliance, and an electric fan, wherein the air flow resistance in an external air inlet port formed independently of a suction port for sucking exhaust air from the electrical appliance is adjustable. According to this configuration, it is easy to secure balance between the exhaust air flow rate of the electrical appliance and the suction force by the electric fan without variably controlling the rotational speed of the electric fan.

8 Claims, 8 Drawing Sheets

25 31 27 9 22 15 26 16 34 5 13 24 23 14 15 12

START
101
TURN ON LIGHT EMITTING PORTION OF PHOTO SENSOR
102
SIGNAL DETECTED BY LIGHT RECEIVING PORTION?
No
Yes
103
DETECTED FOR PREDETERMINED TIME PERIOD?
No
Yes
104
TURN ON ELECTRIC FAN
105
SIGNAL NOT DETECTED BY LIGHT RECEIVING PORTION?
Yes
No
107
PREDETERMINED TIME ELAPSED?
No
Yes
108
ISSUE ABNORMALITY ALARM
106
TURN OFF ELECTRIC FAN
WAIT FOR MAINTENANCE

OPTIONAL DEVICE FOR ELECTRICAL APPLIANCE

CROSS-REFERENCE TO RELATED APPLICATIONS

The present application claims priority under 35 U.S.C. § 119 to Japanese Patent Application No. 2015-63279, filed Mar. 25, 2015. The contents of this application are incorporated herein by reference in their entirety.

BACKGROUND OF THE INVENTION

Field of the Invention

The present invention relates to an option device for an electrical appliance, which is mounted on the electrical appliance, and provided with a filter for purifying exhaust air from the electrical appliance, and an electric fan.

Discussion of the Background

Exhaust air from an electrical appliance such as an image forming apparatus contains ultrafine particles (UFP) such as siloxane which may be generated when silicon is heated, or hydrocarbon which may be generated when toner is melted at a high temperature. In recent years, regulations regarding such ultrafine particles are becoming strict. In view of the above, there is a demand for an electrical appliance, in which ultrafine particles in exhaust air are trapped by a filter or a like member, and purified air is discharged to the atmosphere. Design that satisfies such regulations has been applied to newly developed electrical appliances. Further, it is also possible to satisfy the regulations regarding ultrafine particles in exhaust air by mounting an option device for an electrical appliance provided with a function of purifying exhaust air as described above (hereinafter, simply called as an option device) on the existing electrical appliances. In this case, it is important to secure balance between the exhaust air flow rate from the electrical appliance, and the suction force by an electric fan in the option device. When the balance is not secured, the air flow inside the electrical appliance may be adversely affected.

As a conventional art related to adjustment of flow of exhaust air from an electrical appliance, Japanese Unexamined Patent Application Publication No. 2013-148299 describes a ventilation device provided with an air intake fan and an exhaust fan. The ventilation device is provided with an openable/closable plate for communicating and blocking air flow in a pipe connection port each serving as a chamber-interior suction port and a chamber-exterior ejection port, and a gear motor for driving the openable/closable plates.

A ventilation device described in Japanese Unexamined Patent Application Publication No. 2013-104656 is provided with a fan motor, an opening adjustment means, and a heating means inside an air intake passage from an external air suction port to an external air blowout port. The ventilation device is configured to prevent dew condensation by heating a part of external air supplied from the external air suction port.

An image forming apparatus described in Japanese Unexamined Patent Application Publication No. 2011-180235 is configured such that exhaust air containing particles which are generated from a heater roller for fixation is allowed to pass through a filter member by a duct and by an exhaust fan, and is discharged from an exit. Controlling the amount of exhaust air passing through the filter member utilizing an initial burst phenomenon makes it possible to extend the life of the filter member which is easily affected by heat.

A radiation detection device described in Japanese Unexamined Patent Application Publication No. 2010-230430 is configured such that changing the intake amount of external air in accordance with the calorific value of a heat generating component disposed on an air passage makes it possible to efficiently cool the heat generating component.

As described above, when an option device provided with a function of purifying exhaust air is mounted on an electrical appliance (such as an image forming apparatus), it is important to secure balance between the exhaust air flow rate from the electrical appliance, and the suction force by an electric fan in the option device. For instance, when the suction force by the electric fan in the option device is larger than a set exhaust air flow rate from the exhaust port of the image forming apparatus, if the air flow rate in the vicinity of a fixing device is larger than the design air flow rate, the temperature of the fixing device may be lowered than a set temperature. This may make it difficult to sufficiently fix the toner. Conversely, when the suction force by the electric fan in the option device is smaller than the set exhaust air flow rate from the exhaust port of the image forming apparatus, it may be difficult to sufficiently exhaust air from the exhaust port of the apparatus main body due to the existence of the option device as a resistance. This may impair the cooling performance of the inside of the image forming apparatus.

When there are electrical appliances of different types having different exhaust air flow rates, as an electrical appliance (image forming apparatus) on which an option device is mounted, preparing option devices of different types having different suction forces in order to handle the different exhaust air flow rates of the electrical appliances is disadvantageous in the aspect of cost and maintenance service. It is desirable to make the suction force of a common option device variable in order to handle electrical appliances of different types.

Further, when one or both of the exhaust air flow rate of the electrical appliance, and the suction force of the option device varies accompanied by use, and as a result when it is difficult to secure balance between the exhaust air flow rate and the suction force, making the suction force of the option device variable makes it easy to secure balance between the exhaust air flow rate of the electrical appliance and the suction force of the option device again. It may be easy to solve the aforementioned drawback by variably controlling the rotational speed of the electric fan in the option device. However, the aforementioned configuration requires an electric fan whose rotational speed is variably controllable, and a control circuit for controlling the electric fan. This may increase the cost.

SUMMARY OF THE INVENTION

An object of the invention is to provide an option device for an electrical appliance, which enables to easily secure balance between the exhaust air flow rate of the electrical appliance and the suction force by an electric fan without variably controlling the rotational speed of the electric fan.

An option device for an electrical appliance of the invention is an option device for an electrical appliance, which is mounted on the electrical appliance, and provided with a filter for purifying exhaust air from the electrical appliance, and an electric fan. The option device is configured such that an air flow resistance in an external air inlet port formed independently of a suction port for sucking exhaust air from the electrical appliance is adjustable.

The air flow resistance means a degree of difficulty when air flows into an option device (into a duct) from the outside (from the atmosphere) through an external air inlet port. When the pressure difference between the outside and the inside of the duct is constant (in other words, when the suction force by the electric fan is constant), as the air flow resistance in the external air inlet port increases, the amount of external air flowing into the duct decreases. Conversely, as the air flow resistance decreases, the amount of external air flowing into the duct increases.

The external air inlet port may be formed in a wall surface of a duct forming an air passage from the air suction port to the filter and to the electric fan, and the air flow resistance in the external air inlet port may be adjusted by changing an area of the external air inlet port. In this case, preferably, the option device may be further provided with an opening which forms the external air inlet port; and a shielding member mounted on the wall surface of the duct in such a manner as to cover a part or an entirety of the opening, wherein the area of the external air inlet port is changed by changing a position of the shielding member.

A plurality of closable openings formed at different positions in a wall surface of a duct forming an air passage from the suction port to the filter and to the electric fan may form the external air inlet port, and the air flow resistance in the external air inlet port may be adjusted by changing the positions of the openings in an opened state.

Further, the option device may be further provided with an opening which forms the external air inlet port in a wall surface of a duct forming an air passage from the suction port to the filter and to the electric fan, and an air passage changing member which adjusts the air flow resistance in the external air inlet port by changing an external air passage to be guided from the opening into the duct.

A gap may be formed between a mounting surface of the option device which covers an exhaust port of the electrical appliance, and a wall surface of the electrical appliance in which the exhaust port is formed, the gap may form the external air inlet port, and the air flow resistance in the external air inlet port may be adjusted by making the gap variable.

Further, the option device for an electrical appliance according to another aspect of the invention may be configured such that the electrical appliance is provided with an exhaust port, and an exhaust fan which discharges air inside the electrical appliance from the exhaust port, and the option device is mounted with respect to the exhaust port of the electrical appliance.

DESCRIPTION OF THE EMBODIMENTS

Figure 1:
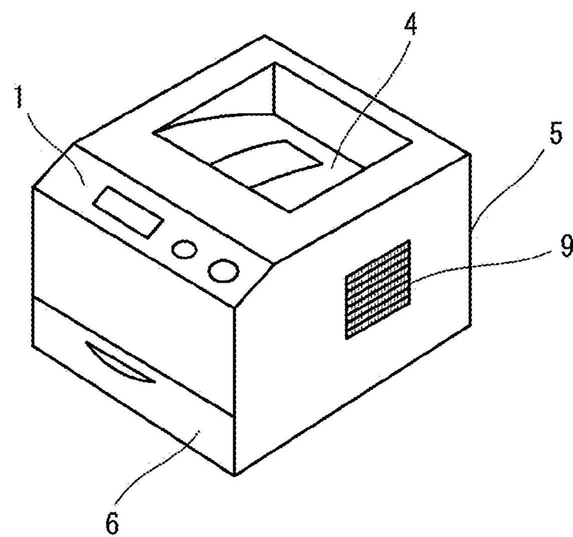
FIG. 1 is a perspective view of a laser printer embodying the invention, as viewed obliquely from the right and front side.

In the following, an embodiment of the invention is described referring to the drawings. FIG. 1 is a perspective view illustrating an example of a laser printer as an image forming apparatus on which an option device embodying the invention is mounted. FIG. 1 is a perspective view of the laser printer as viewed obliquely from the front and right side. In the following description, when terms indicating a specific direction or position (e.g. "left-right direction" or "up-down direction") are used according to needs, the front surface of the image forming apparatus where an operation panel 1 is provided is the front side, and the directions are described with respect to the front side.

The laser printer is provided with the operation panel 1 including a liquid crystal display device and operation buttons on an upper portion of the front surface of an apparatus main body 5. A discharge tray 4 on which printed sheets are discharged and stacked is provided on the upper surface of the apparatus main body 5 at a position behind the operation panel 1. The apparatus main body 5 is internally provided with an image forming assembly including a photosensitive drum, an exposure device, a developing device, a transfer device, and a fixing device. A sheet tray 6 in which recording sheets of a predetermined size to be fed to the image forming assembly is mounted on the lower side of the apparatus main body 5.

A sheet fed from the sheet tray 6 is fed to the image forming assembly in the apparatus main body 5. The exposure device is controlled in accordance with image data transmitted from e.g. a personal computer connected to the laser printer, and an electrostatic latent image is formed on the photosensitive drum. The electrostatic latent image is developed into a toner image by the developing device. The toner image is transferred onto the sheet by the transfer device, and is fixed by the fixing device by heating. In other words, a toner image is transferred onto a sheet fed to the image forming assembly while being conveyed along a predetermined conveyance path. After the image fixation, the sheet is discharged onto the discharge tray 4.

Figure 2:
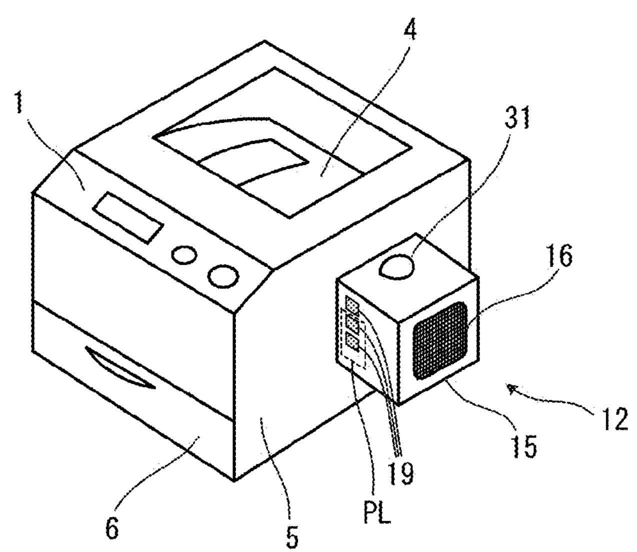
FIG. 2 is a perspective view of the laser printer illustrated in FIG. 1 in a state that an option device embodying the invention is mounted on the laser printer.
Figure 3:
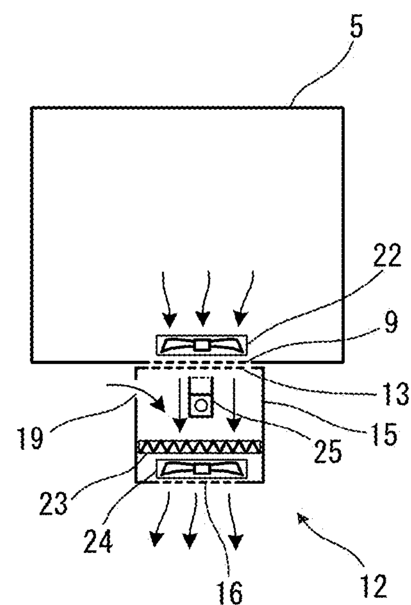
FIG. 3 is a schematic plan view illustrating the inside of the option device and the inside of a main body of the laser printer.

An exhaust port 9 is formed in the right surface of the apparatus main body 5. The option device embodying the invention is mounted in such a manner as to cover the exhaust port 9. FIG. 2 is a perspective view of the laser printer illustrated in FIG. 1 in a state that an option device 12 is mounted on the laser printer. FIG. 3 is a schematic plan view illustrating the inside of the option device 12 and the inside of the apparatus main body 5 of the laser printer.

The laser printer in the embodiment is configured such that the exhaust port 9 is formed in the right surface of the apparatus main body 5, and a suction port (not illustrated) is formed in the left surface of the apparatus main body 5. An exhaust fan (cooling fan) 22 is disposed inside the exhaust port 9. Air sucked into the apparatus main body 5 of the laser printer through the suction port from the outside cools the fixing device and the other heat generating components inside the apparatus main body 5, and thereafter, is discharged from the exhaust port 9 to the outside of the apparatus main body 5 by the exhaust fan 22. The exhaust air (air flow) contains ultrafine particles (UFP) generated in the developing device or in the fixing device. If ultrafine particles are discharged to the atmosphere without any treatment, it may be impossible to satisfy the regulations regarding ultrafine particles, which are becoming strict in European countries. A filter may be provided inside the exhaust port 9. However, if a simple filter having a relatively coarse mesh is used, it may be impossible to sufficiently trap ultrafine particles contained in exhaust air (cooling air).

In view of the above, an option device 12, which is a box-shaped clean unit having an air purifying function, and provided with a duct 15 which guides exhaust air from the exhaust port 9, a high efficiency particulate air filter 23 of a fine mesh (hereinafter, called as a HEPA filter), and an electric fan 24, is mounted on the apparatus main body 5 for sufficiently trapping ultrafine particles contained in exhaust air from the exhaust port 9 by the fine mesh filter in the option device (clean unit) 12, and for discharging purified air from the clean unit 12. The option device (clean unit) 12 is relatively lightweight. It is easy to mount the option device 12 on the apparatus main body 5 of the laser printer with use of e.g. a double-sided tape or an L-shaped bracket. Further, a dome-shaped windshield 31 which covers the exit of an air flow sensor to be described later for preventing inflow of air from the outside is provided above the upper surface of the option device 12, and an external air inlet port 19 is formed in a side surface of the clean unit 12.

In FIG. 3 schematically illustrating the inside of the apparatus main body 5 of the laser printer and the inside of the clean unit 12, and in the drawings to be referred to in the following description, air flows such as an exhaust air flow are depicted by the solid line arrows. Exhaust air discharged from the exhaust port 9 is guided from a suction port 13 of the clean unit 12 to the HEPA filter 23 through the duct 15. The air that has been purified through the HEPA filter 23 is discharged from an exhaust port 16 of the clean unit 12 by the electric fan 24.

Further, the clean unit 12 is provided with an air flow sensor 25 which determines a state of the laser printer (whether the laser printer is in a standby state or in a printing state) by detecting the presence of absence of exhaust air from the apparatus main body 5 of the laser printer whether the pressure of exhaust air is not smaller than a predetermined wind pressure or is smaller than the predetermined wind pressure), and a control device which controls an operation of the electric fan 24 (in other words, an operation of the clean unit 12) on the basis of an output signal from the air flow sensor 25. According to this configuration, the clean unit 12 can operate the electric fan 24 (operate the air purifying function of the clean unit 12) as necessary in accordance with an operation state of the laser printer without the need of electrical connection to the laser printer. Note that an electric power for operating the control device and the electric fan 24 is not supplied from the laser printer, but is supplied from a commercial power supply (AC 100V) to a power supply circuit of the clean unit 12.

Figure 4:
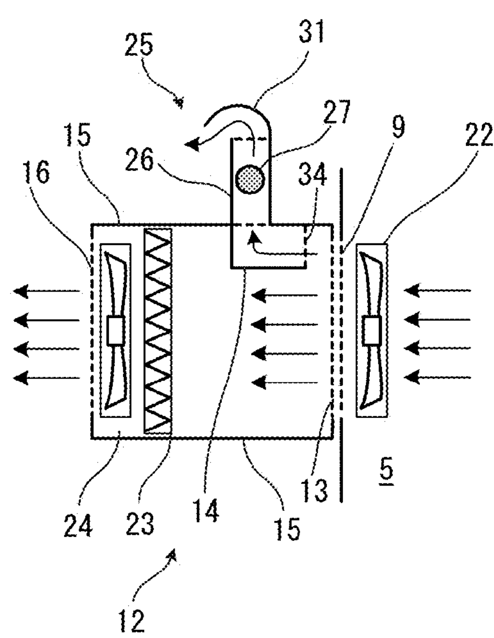
FIG. 4 is a schematic side view illustrating the inside of the option device and the inside of the laser printer main body in the vicinity of an exhaust port.
Figure 5:
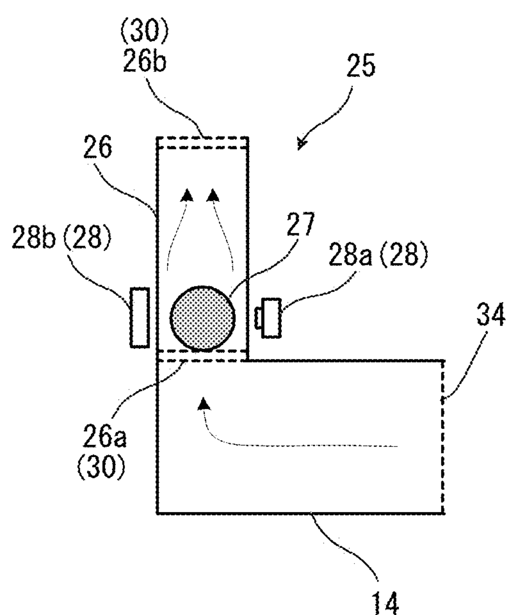
FIG. 5 is a schematic side view illustrating a structure and a detection principle of an air flow sensor.
Figure 6:
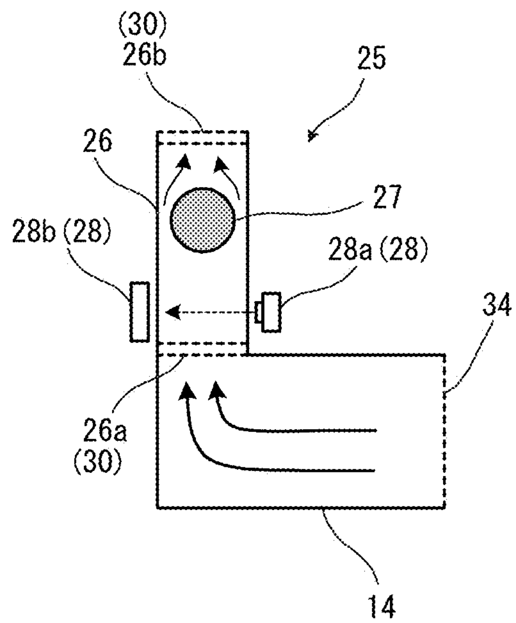
FIG. 6 is a schematic side view illustrating the structure and the detection principle of the air flow sensor.

FIG. 4 is a schematic side view illustrating the inside of the option device 12 and the inside of the apparatus main body 5 of the laser printer in the vicinity of the exhaust port 9. FIG. 5 and FIG. 6 are schematic side views illustrating a structure and a detection principle of the air flow sensor 25. The air flow sensor 25 is provided with a tubular case 26 which takes in a part of exhaust air discharged from the exhaust port 9 to the inside of the duct 15 of the clean unit 12 by the exhaust fan (cooling fan) 22 for forming an air passage different from the air flow flowing through the duct 15, a detection object 27 which floats and moves inside the tubular case 26, and a photo sensor 28 as a detector which detects movement of the detection object 27 and outputs an electrical signal.

The tubular case 26 is provided with an entrance 26*a* of air flow (exhaust air), and an exit 26*b* which communicates with the atmosphere on the outside of the duct 15. The photo sensor 28 is disposed on the outer surface of the tubular case 26 at a position near the entrance 26*a*. Further, the air passage from the entrance 26*a* to an exhaust air intake port 34 is isolated from the other portion of the inside of the duct 15 by a partition wall 14. The exhaust air intake port 34 is opened toward exhaust air to be discharged from the exhaust port 9. Isolating the air passage extending to the detection object 27 of the photo sensor 28 from the other portion of the inside of the duct 15 by the partition wall 14 and by the tubular case 26 makes it possible to sufficiently suppress an influence of air flow, even when the electric fan 24 of the clean unit 12 is operated. This makes it possible to accurately detect the presence or absence of exhaust air from the apparatus main body 5 of the laser printer by the air flow sensor 25.

The photo sensor 28 composing the air flow sensor 25 is a transmissive photo sensor, which is configured such that a light emitting portion 28*a* and a light receiving portion 28*b* face each other radially with respect to the tubular case 26. The detection object 27 is an object obtained by forming a lightweight foamed material such as foamed polystyrene into a ball shape. The diameter of the detection object 27 is smaller than the innermost diameter of the tubular case 26 so that air flows are generated in the gap between the detection object 27 and the inner wall of the tubular case 26.

When the pressure of exhaust air (air flow) flowing through the tubular case 26 is smaller than a predetermined wind pressure, as illustrated in FIG. 5, the detection object 27 is located at an initial position near the entrance 26*a* of the tubular case 26 by the weight thereof. When the detection object 27 is located at the initial position, light emitted from the light emitting portion 28*a* of the photo sensor 28 is blocked by the detection object 27, and does not impinge at the light receiving portion 28*b*. Therefore, a light detection signal is not output from the light receiving portion 28*b*, On the other hand, when the pressure of exhaust air (air flow) flowing through the tubular case 26 is equal to or larger than the predetermined wind pressure, as illustrated in FIG. 6, the detection object 27 moves (floats) from the initial position as being pressed by the air flow. By the movement of the detection object 27, light emitted from the light emitting portion 28*a* of the photo sensor 28 impinges at the light receiving portion 28*b* without being blocked by the detection object 27, and a light detection signal is output from the light receiving portion 28*b*. Thus, it is possible to judge whether the pressure of exhaust air (air flow) is equal to or lamer than a predetermined wind pressure on the basis of the presence or absence of a light detection signal from the light receiving portion 28*b*.

When a printing process of the laser printer is executed, the exhaust fan (cooling fan) 22 is rotated at the full speed. This state corresponds to a state in which the pressure of exhaust air (air flow) is equal to or larger than a predetermined wind pressure. When a printing process of the laser printer is not executed (when the laser printer is in a standby state), the exhaust fan (cooling fan) 22 is stopped, or is rotated at a slow speed. This state corresponds to a state in which the pressure of exhaust air (air flow) is smaller than the predetermined wind pressure. In the present specification, the expression "presence or absence of exhaust air (air flow)" indicates a contrast between a state that the pressure of exhaust air (air flow) is equal to or larger than a predetermined wind pressure, and a state that the pressure of exhaust air (air flow) is smaller than the predetermined wind pressure unless otherwise specifically mentioned.

The tubular case 26 is required to be configured such that at least a portion of the tubular case 26 corresponding to an optical path from the light emitting portion 28*a* of the photo sensor 28 to the light receiving portion 28*b* of the photo sensor 28 is made of a material capable of transmitting light (e.g. a transparent resin). It is preferable to paint the entirety of the circumferential wall of the tubular case 26 black (or paint a light impermeable painter) in order to prevent an influence (noise) of external light on the light receiving portion of the photo sensor 28; and to remove the paint in a slit-like form so that light passes only through the portion of the tubular case 26 corresponding to the optical path from the light emitting portion 28*a* of the photo sensor 28 to the light receiving portion 28*b* of the photo sensor 28.

Figures 7A, 7B:
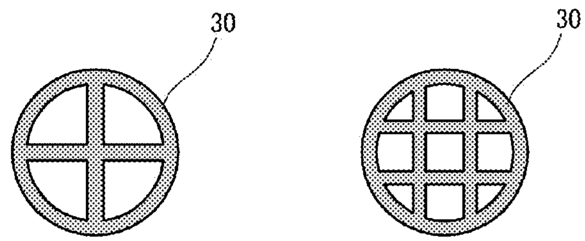
FIG. 7A is a plan view of a cross-shaped locking member provided near an entrance and an exit of a case of the air flow sensor.
FIG. 7B is a plan view of a double-cross-shaped locking member.

Further, a locking member 30 for preventing the detection object 27 from slipping off from the tubular case 26 is provided near the entrance 26*a* of the tubular case 26 and near the exit 26*b* of the tubular case 26, The locking members 30 also serve as regulating members for regulating the air flows. As illustrated in FIG. 7A, the locking member 30 is a resin molded product such that a cross-shaped locking portion is integrally formed inside a circular frame in plan view. Forming the locking member 30 to have a certain thickness allows for the locking member 30 to function as a resulting member. The shape of the locking member 30 is not limited to the planar shape illustrated in FIG. 7A. For instance, it is possible to form the locking member 30 in such a shape that a double-cross-shaped locking portion is integrally formed inside a circular frame, as illustrated in FIG. 7B. It is also possible to integrally form a grid-shaped locking portion whose number of grids is larger than the number of grids of the aforementioned locking members 30 inside a circular frame. Further, as illustrated in FIG. 4, the dome-shaped windshield 31 for preventing inflow of air from the outside into the tubular case 26 is provided at the exit of the tubular case 26.

Figure 8:
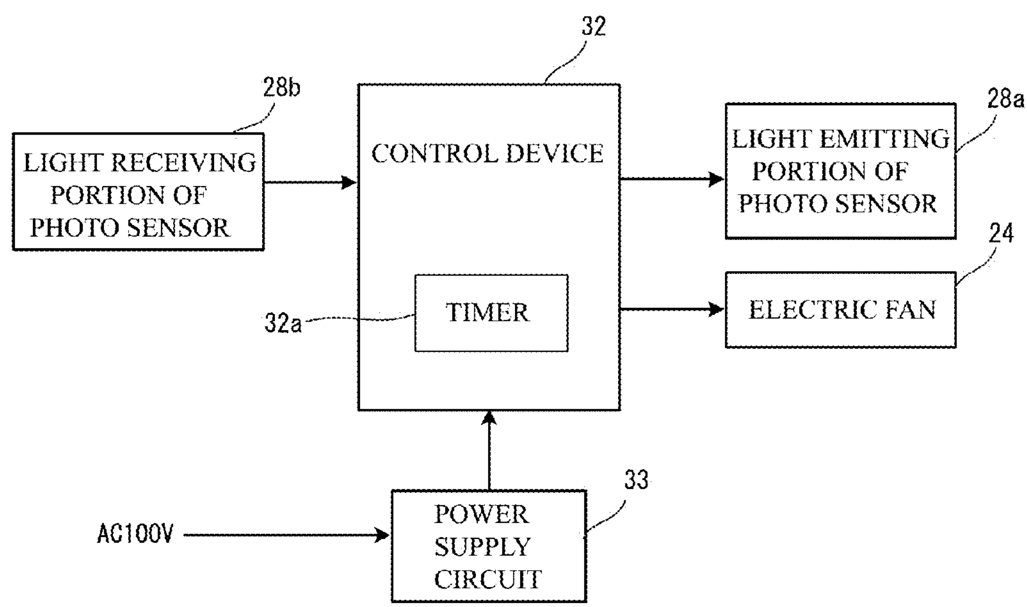
FIG. 8 is a block diagram illustrating a configuration of an electrical circuit of the option device.

Next, FIG. 8 illustrates a configuration of an electrical circuit of the clean unit 12. The clean unit 12 is provided with a control device 32 which controls the electric fan 24 in the clean unit (option device) 12 on the basis of an output signal (detection signal) from the light receiving portion 28*b* of the photo sensor 28 composing the air flow sensor 25. The control device 32 may be constituted by a microcomputer which is operated in accordance with a program, but may be constituted by an electronic circuit using discrete components. The control device 32 further includes a drive circuit for driving the light emitting portion (LED) 28*a* of the photo sensor 28, in addition to a drive circuit for driving the electric fan 24 for pulse-driving the light emitting portion 28*a* of the photo sensor 28. The clean unit 12 is further provided with a power supply circuit 33 which generates a voltage for operating the electric fan 24, the light emitting portion 28*a* of the photo sensor 28, and the control device 32. The power supply circuit 33 is connected to a commercial power supply (AC 100V).

Figure 9:
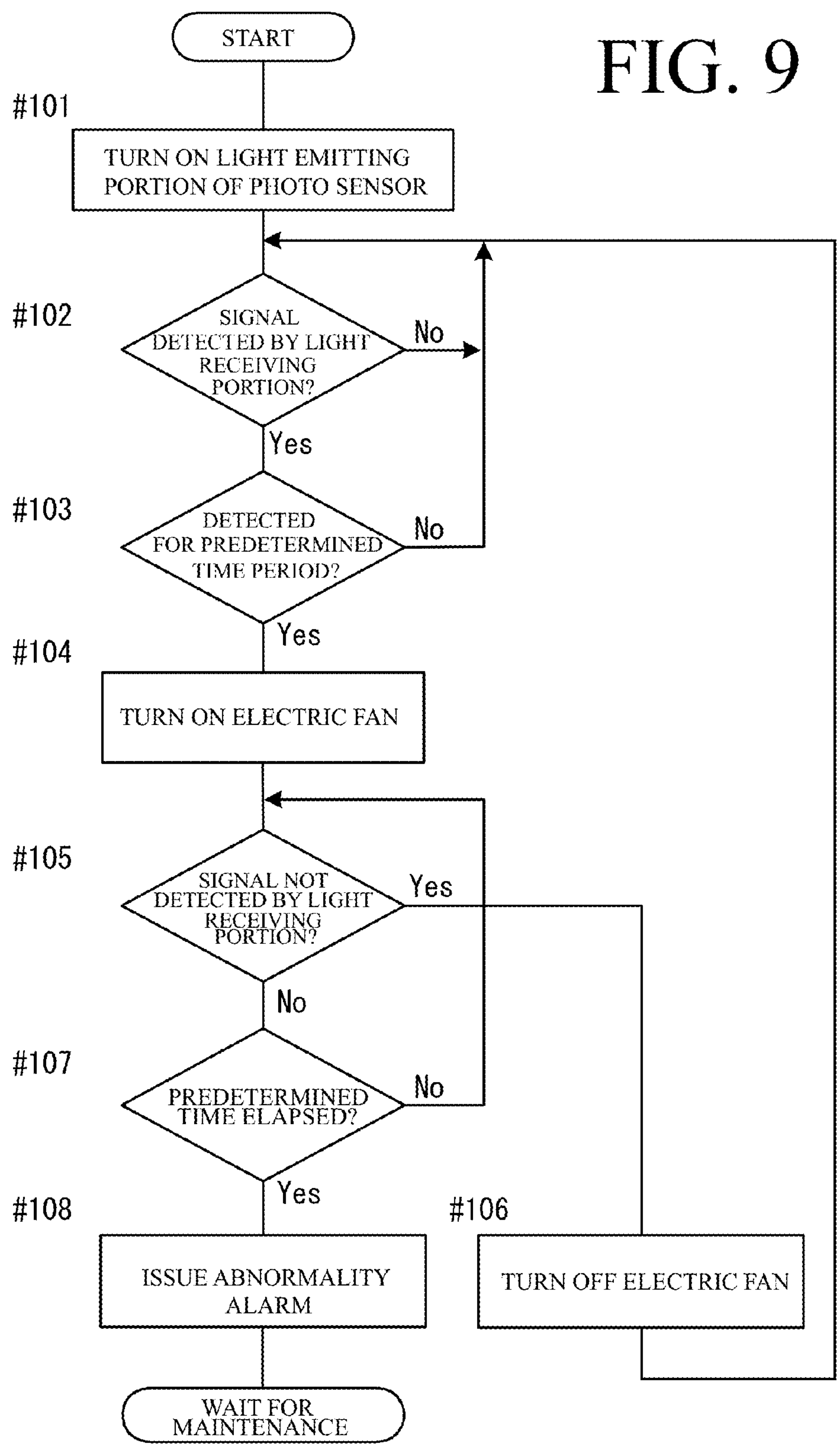
FIG. 9 is a flowchart illustrating an example of control to be performed by a control device in the option device.

Next, an example of control to be performed by the control device 32 is described according to the flowchart illustrated in FIG. 9. The control device 32 turns on the light emitting portion 28*a* of the photo sensor 28 in Step #101, and checks whether a detection signal of the light receiving portion 28*b* of the photo sensor 28 is present (e.g. whether a signal is at a high level) in Step #102. In other words, the control device 32 checks an operation state from the presence or absence of exhaust air from the laser printer, and judges whether the electric fan 24 (clean unit 12) is to be operated.

As described above, when a printing process of the laser printer is executed, the exhaust fan (cooling fan) 22 is rotated at the full speed. The detection object 27 of the air flow sensor 25 floats by the pressure of exhaust air (air flow), and light emitted from the light emitting portion 28*a* of the photo sensor 28 is input to the light receiving portion 28*b* of the photo sensor 28 without being blocked by the detection object 27. Therefore, the laser printer is brought to a state in which a detection signal from the light receiving portion 28*b* of the photo sensor 28 is present. On the other hand, when a printing process of the laser printer is not executed (when the laser printer is in a standby state), the exhaust fan (cooling fan) 22 is stopped or is rotated at a slow speed. In this state, the detection object 27 of the air flow sensor 25 is at a low position (initial position) by the weight thereof, and light emitted from the lily emitting portion 28*a* of the photo sensor 28 is blocked by the detection object 27 and does not impinge at the light receiving portion 28*b* of the photo sensor 28. Therefore, the laser printer is brought to a state in which a detection signal from the light receiving portion 28*b* of the photo sensor 28 is absent (e.g. the signal is at a low level). Thus, the control device 32 checks the presence or absence of a detection signal from the light receiving portion 28*b* of the photo sensor 28 (checks whether the detection signal is at a high level or at a low level), thereby judging the presence or absence of exhaust air from the laser printer (the operation state of the laser printer), and controls the operation of the electric fan 24 (clean unit 12) on the basis of the judgment result.

When there is no detection signal from the light receiving portion 28*b* of the photo sensor 28, the routine returns to the judgement in Step #102. In other words, the electric fan 24 is kept in an off-state. When there is a detection signal from the light receiving portion 28*b* of the photo sensor 28, the routine proceeds to Step #103, and the control device 32 checks whether detection of the presence of a detection signal from the light receiving portion 28*b* of the photo sensor 28 is continued for a predetermined time period (e.g. for ten seconds). When detection of the absence of a detection signal from the light receiving portion 28*b* of the photo sensor 28 is continued for the predetermined time period, in other words, when the absence of a detection signal from the light receiving portion 28*b* of the photo sensor 28 is detected within the predetermined time period, the routine returns to the judgment in Step #102 (in this state, the electric fan 24 is kept in an off-state). The control device 32 is provided with a built-in timer 32*a* (see FIG. 8) which counts an internal clock. The predetermined time period is measured with use of the built-in timer 32*a*.

When detection of the presence of a detection signal from the light receiving portion 28*b* of the photo sensor 28 is continued for the predetermined time period, the routine proceeds to Step #104, and the electric fan 24 is turned on. This makes it possible to prevent an erroneous operation due to fluctuation of air flow, vibrations of devices, or external noise, and to prevent a chattering phenomenon that the electric fan 24 repeats on and off at a short cycle.

Thereafter, in Step #105, the control device 32 checks whether there is no detection signal from the light receiving portion 28*b* of the photo sensor 28. When a printing process of the laser printer is finished, the rotational speed of the exhaust fan (cooling fan) 22 is decreased (and after an elapse of a certain time period, the exhaust fan 22 is stopped). Then, there is no detection signal from the light receiving portion 28*b* of the photo sensor 28. Therefore, the control device 32 turns off the electric fan 24 in Step #106 so as to stop the operation of the clean unit 12. Thereafter the routine returns to Step #102, and repeats the aforementioned process.

In Step #105 when there is a detection signal from the light receiving portion 28*b* of the photo sensor 28 (when detection of the presence of a detection signal is continued), the routine proceeds to Step #107, and the control device 32 checks whether a predetermined time period (e.g. ten minutes) has elapsed from start of operating the electric fan 24. A state that the operation of the electric fan 24 (operation of the clean unit 12) is continued for the predetermined time period is an anomalous state. In this case, an abnormality alarm is issued in Step #108 to notify the user of an anomalous state. For instance, an abnormality alarm is issued by displaying an indicator (LED) (not illustrated) in a blinking manner, or by outputting a buzzer sound. Then, the clean unit 12 is brought to a maintenance waiting state in which the clean unit 12 waits for a reset process or the like by the user.

As described above, the control device 32 checks the presence or absence (logic level) of a detections signal from the light receiving portion 28*b* of the photo sensor 28 composing the air flow sensor 25, thereby judging the presence or absence of exhaust air from the laser printer (operation state of the laser printer), and controls the operation of the electric fan 24 (clean unit 12) on the basis of the judgement result. When a printing, process of the laser printer is executed, the exhaust fan (cooling fan) 22 is rotated at the full speed, and ultrafine particles are contained in the exhaust air. In view of the above, the control device 32 causes the electric fan 24 (clean unit 12) to operate on the basis of a detection signal from the air flow sensor 25, causes the HEPA filter 23 to trap ultrafine particles in exhaust air, and causes the electric fan 24 to discharge purified exhaust air from the exhaust port 16 of the clean unit 12.

Referring back to FIG. 2 and FIG. 3, a configuration for securing balance between the exhaust air flow rate (from the exhaust port 9 of the apparatus main body 5) of the laser printer and the suction force by the electric fan 24 in the clean unit (option device) 12 is described. If the balance between the exhaust air flow rate from the exhaust port 9 of the apparatus main body 5 and the suction force by the electric fan 24 in the clean unit 12 is not secured, the flow of cooling air inside the apparatus main body 5 may be adversely affected.

For instance, when the suction force by the electric fan 24 in the clean unit 12 is larger than the set exhaust air flow rate in the exhaust port 9, if the air flow rate in the vicinity of the fixing device in the apparatus main body 5 is larger than the design air flow rate, the temperature of the fixing device may be lowered than a set temperature. This may make it difficult to sufficiently fix the toner. Conversely, when the suction force by the electric fan 24 in the clean unit 12 is smaller than the set exhaust air flow rate in the exhaust port 9, it may be difficult to sufficiently exhaust air from the exhaust port 9 due to the existence of the clean unit 12 as a resistance. This may impair the cooling performance of the inside of the apparatus main body 5.

When the exhaust fan 22 provided in the apparatus main body 5 of the laser printer, and the electric fan 24 in the clean unit 12 have the same size and the same air blow capacity, it is possible to secure balance between the exhaust air flow rate in the exhaust port 9 in the apparatus main body 5 and the suction force by the electric fan 24 in the clean unit 12 by rotating the electric fan 24 substantially at the same rotational speed as the rotational speed of the exhaust fan 22 (rotational speed when the exhaust fan 22 is rotated at the full speed).

However, when there e laser printers of different types having different exhaust air flow rates, as a laser printer (image forming apparatus) on which the clean unit 12 as an option device is mounted, preparing clean units 12 of different types having different suction forces in order to handle the different exhaust air flow rates of the image forming apparatus is disadvantageous in the aspect of cost and maintenance service. If the suction force of the clean unit 12 is variable, it is possible to handle image forming apparatus of different types. Further, when one or both of the exhaust air flow rate of the image forming apparatus and the suction force of the clean unit 12 varies accompanied by use, it may be difficult to secure balance between the exhaust air flow rate and the suction force. In this case, making the suction force of the clean unit 12 variable makes it easy to secure balance between the exhaust air flow rate of the image forming apparatus and the suction force of the clean unit 12 again.

It may be easy to solve the aforementioned drawback by variably controlling the rotational speed of the electric fan 24 in the clean unit 12. However, the aforementioned configuration requires use of an electric fan 24 whose rotational speed is variably controllable. This may increase the cost. In view of the above, the clean unit 12 of the embodiment is configured such that with use of a relatively inexpensive electric fan whose rotational speed is not variably controllable, the external air inlet port 19 is formed in a side surface of the duct 15, and the amount of external air to be sucked into the duct 15 from the external air inlet port 19 is adjusted (in other words, the air flow resistance in the external air inlet port 19 is adjusted). This makes it easy to secure balance between the exhaust air flow rate in the exhaust port 9 of the image forming apparatus and the suction force by the electric fan 24.

Specifically, as illustrated in FIG. 2, three small rectangular openings composing the external air inlet port 19 are formed in a side surface of the duct 15 of the clean unit 12 in such a manner that the openings are aligned in a vertical direction. A laminate panel PL indicated by the broken line contour is attached to the side surface of the duct 15 in such a manner as to cover the lower two rectangular openings. The laminate panel PL corresponds to a shielding member attached to a wall surface of the duct 15 in such a manner as to cover a part or the entirety of the three rectangular openings in the external air inlet port 19. Changing the attaching position of the laminate panel (shielding member) PL makes it possible to change the area (opening area) of the external air inlet port 19.

When the amount of external air to be sucked into the inside of the duct 15 increases by an increase in the opening area of the external air inlet port 19, the suction force by the electric fan 24 in the exhaust port 9 of the image forming apparatus decreases. Conversely, when the amount of external air to be sucked into the inside of the duct 15 decreases by a decrease in the opening area of the external air inlet port 19, the suction force by the electric fan 24 in the exhaust port 9 of the image forming apparatus increases.

As described above, increasing or decreasing the opening area of the external air inlet port 19 makes it possible to increase or decrease the amount of external air to be sucked into the inside of the duct 15, and the suction force by the electric fan 24 in the exhaust port 9 of the image forming apparatus varies in inverse proportion to an increase or a decrease in the opening area of the external air inlet port 19. Therefore, changing the attaching position of the laminate panel PL (including a case in which a laminate panel is not attached) makes it possible to adjust the opening area of the external air inlet port 19 (adjust the air flow resistance). This makes it easy to secure balance between the exhaust air flow rate in the exhaust port 9 of the image forming apparatus and the suction force by the electric fan 24.

A method for adjusting the opening area of the external air inlet port 19 (adjusting the air flow resistance) is not limited to the aforementioned method in which the attaching position of the laminate panel PL is changed. For instance, it is possible to provide a shielding member (shielding plate) slidably movable along a wall surface of the duct 15, and to adjust the opening area of the external air inlet port 19 by allowing the shielding plate to block a part or the entirety of the external air inlet port 19.

Figure 10A:
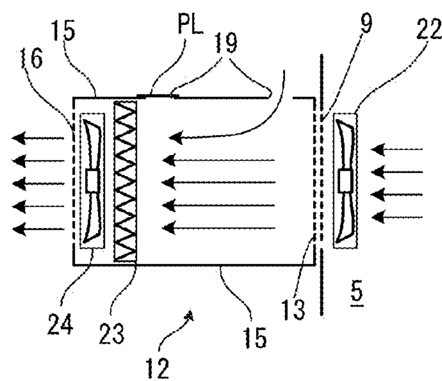
FIG. 10A is a schematic diagram illustrating, in a first modification of a method for adjusting the air flow resistance in an external air inlet port, a case in which an opening near a suction port of a duct is in an opened state, and an opening near an electric fan is closed by a laminate panel PL.
Figure 10B:
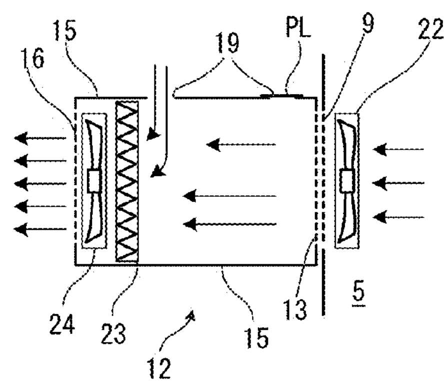
FIG. 10B is a schematic diagram illustrating a case, in which the opening near the electric fan is in an opened state, and the opening near the suction port of the duct is closed by the laminate panel.

Further, a method for adjusting the air flow resistance in the external air inlet port 19 is not limited to a method in which the opening area is adjusted. In the following, examples of the method other than the above are described as some of the modifications. FIGS. 10A and 10B are schematic diagrams illustrating the inside of a clean unit (option device) 12 and the inside of an apparatus main body 5 of a laser printer in the vicinity of an exhaust port in the first modification. In the first modification, a plurality of closable openings formed in different positions of a duct 15 of the clean unit 12 compose an external air inlet port 19. The air flow resistance in the external air inlet port 19 is adjusted by changing the positions of the openings in an opened state.

In the state illustrated in FIG. 10A, an opening at a position near the suction port 13 of the duct 15 is in an opened state, and an opening at a position near an electric fan 24 is closed by a laminate panel PL. Conversely, in the state illustrated in FIG. 10B, an opening at a position near the electric fan 24 is in an opened state, and an opening at a position near the suction port 13 of the duct 15 is closed by the laminate panel PL. The clean unit 12 in the state illustrated in FIG. 10B, in which an opening at a position near the electric fan 24 is in an opened state sucks a larger amount of external air than in the state illustrated in FIG. 10A (the air flow resistance in the external air inlet port 19 is smaller in the state illustrated in FIG. 10B). Therefore, the suction force by the electric fan 24 in an exhaust port 9 of the apparatus main body 5 of the laser printer in the state illustrated in FIG. 10B is smaller than in the state illustrated in FIG. 10A. In this way, as well as the embodiment, it is easy secure balance between the exhaust air flow rate in the exhaust port 9 of the image forming apparatus and the suction force by the electric fan 24 by adjusting the air flow resistance in the external air inlet port 19.

In the first modification, a shielding member (shielding plate) slidably movable along a wall surface of the duct 15 may be provided, in place of a laminate panel PL, and the shielding plate may be moved to selectively close one of the openings composing the external air inlet port 19.

Figure 11A:
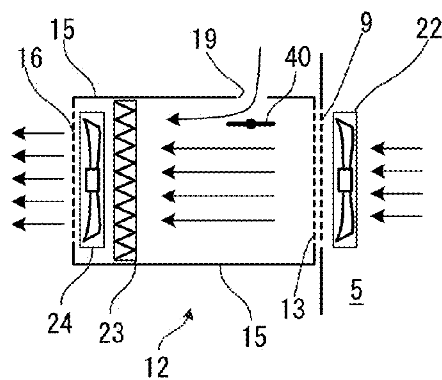
FIG. 11A is a schematic diagram illustrating, in a second modification of the method for adjusting the air flow resistance in an external air inlet port, a case in which an air passage changing member changes the external air passage.
Figure 11B:
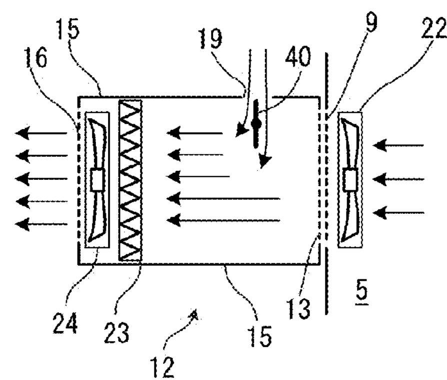
FIG. 11B is a schematic diagram illustrating a case, in which the external air passage changing member does not change the external air passage.

Next, FIGS. 11A and 11B are schematic diagrams illustrating the inside of a clean unit 12 and the inside of an apparatus main body 5 of a laser printer in the vicinity of an exhaust port in the second modification. In the second modification, an opening (external air inlet port 19) is formed in a duct 15 of the clean unit 12. An air passage changing member 40 which adjusts the air flow resistance in the external air inlet port 19 by changing an external air passage to be guided from the opening into the duct is provided. The air passage changing member 40 is a plate-like member which is pivotally movable around an axis passing through the duct 15 in a vertical direction (a direction perpendicular to the plane of FIG. 11A and FIG. 11B).

In the state illustrated in FIG. 11A, the air passage changing member 40 extends in a direction in parallel to an exhaust air flow inside the duct 15, in other words, extends in a direction perpendicular to the flow of external air to be guided from the opening (external air inlet port 19). This makes it possible to change the external air passage. On the other hand, in the state illustrated in FIG. 11B, the air passage changing member 40 extends in a direction in parallel to the flow of external air to be guided from the opening (external air inlet port 19), and the external air passage is not changed by the air passage changing member 40. A holding member such as a dial is fixed to a shaft for pivotally moving the air passage changing member 40 on the outside of the duct 15. Turning the holding member makes it possible to change (pivotally move) the air passage changing member 40 between the state illustrated in FIG. 11A, and the state illustrated in FIG. 11B.

The clean unit 12 in the state illustrated in FIG. 11B, in which the external air passage to be guided from the opening (external air inlet port 19) is not changed by the air passage changing member 40 sucks a larger amount of external air than in the state illustrated in FIG. 11A, in which the external air passage is changed by the air passage changing member 40 (the air flow resistance in the external air inlet port 19 is smaller in the state illustrated in FIG. 11B). Therefore, the suction force by an electric fan 24 in an exhaust port 9 of the apparatus main body 5 of the laser printer in the state illustrated in FIG. 11B is smaller than in the state illustrated in FIG. 11A. In this way, as well as the embodiment, it is easy to secure balance between the exhaust air flow rate in the exhaust port 9 of the image forming apparatus, and the suction force by the electric fan 24 by adjusting the air flow resistance in the external air inlet port 19.

Figure 12A:
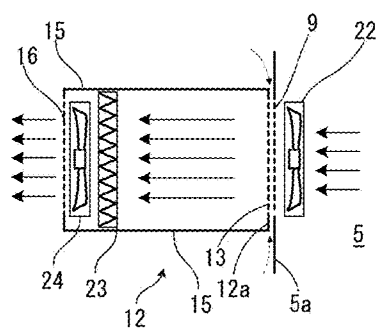
FIG. 12A is a schematic diagram illustrating, in a third modification of the method for adjusting the air flow resistance in an external air inlet port, a case in which a gap is substantially zero.
Figure 12B:
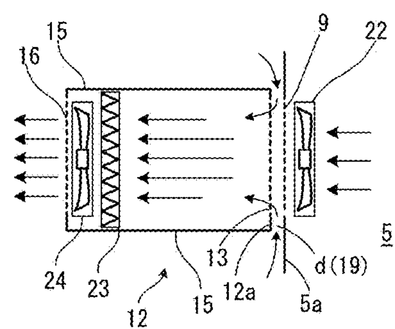
FIG. 12B is a schematic diagram illustrating a state that a certain gap is secured.

Next, FIGS. 12A and 12B are schematic diagrams illustrating the inside of a clean unit 12 and the inside of an apparatus main body 5 of a laser printer in the vicinity of an exhaust port in the third modification. In the third modification, a gap d is formed between a mounting surface 12*a* of the clean unit 12 which covers an exhaust port 9 of the apparatus main body 5 of the laser printer, and a wall surface 5*a* in which the exhaust port 9 of the apparatus main body 5 of the laser printer is formed. The gap d forms an external air inlet port 19. Making the gap d variable makes it possible to adjust the air flow resistance in the external air inlet port 19. For instance, it is possible to secure the gap d by placing a predetermined spacer between the mounting surface 12*a* of the clean unit 12 and the wall surface 5*a* of the apparatus main body 5 of the laser printer. The gap d is substantially zero if a spacer is not inserted.

FIG. 12A illustrates a state, in which the gap d is substantially zero. In this state, the air flow resistance in the external air inlet port 19 is indefinite, and external air to be guided from the external air inlet port 19 is substantially zero. On the other hand, FIG. 12B illustrates a state, in which the predetermined gap d is secured. In this state, external air is sucked from the gap d as the external air inlet port 19 (the air flow resistance in the external air inlet port 19 falls to a predetermined value). External air sucked from the gap d is guided to the inside of a duct 15 from a suction port 13 of the clean unit 12 along with exhaust air to be discharged from the exhaust port 9 of the apparatus main body 5 of the laser printer. Therefore, the suction force by an electric fan 24 in the exhaust port 9 of the apparatus main body 5 of the laser printer in the state illustrated in FIG. 12B is smaller than in the state illustrated in FIG. 12A. In this way, as well as the embodiment, it is easy to secure balance between the exhaust air flow rate in the exhaust port 9 of the image forming apparatus and the suction force by the electric fan 24 by adjusting the air flow resistance in the external air inlet port 19.

The embodiment of the invention as described above is merely an example. It is possible to apply a variety of modifications in addition to the modifications described above as necessary. Further, in the embodiment, an option device (clean unit) 12 is mounted on a laser printer having one exhaust port 9. The following is a summary of another embodiment, in which an option device unit) 12 is mounted on a complex machine having a plurality of exhaust ports.

Figure 13:
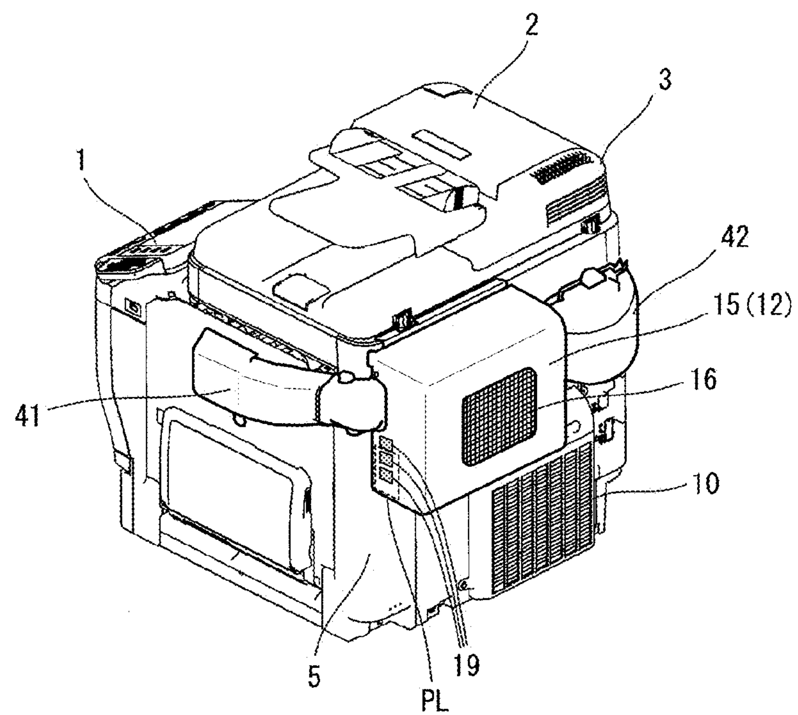
FIG. 13 is a perspective view illustrating a state that an option device as another embodiment of the invention is mounted on a complex machine.
Figure 14:
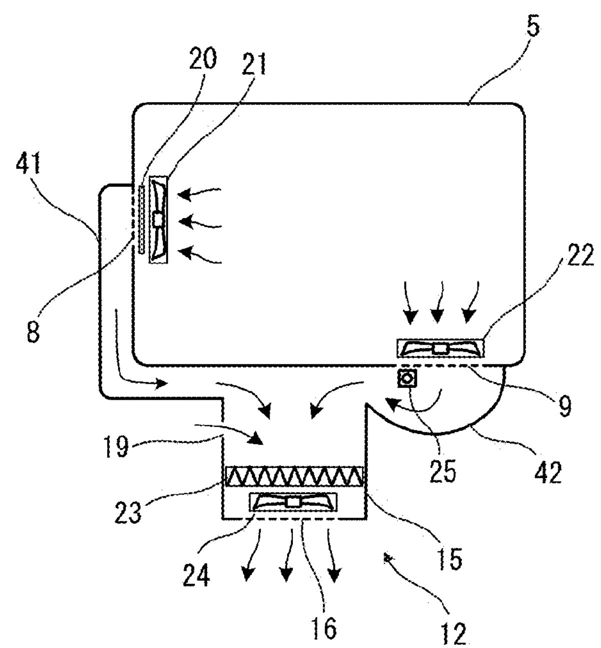
FIG. 14 is a schematic plan view illustrating the inside of the option device and the inside of the complex machine illustrated in FIG. 13.

FIG. 13 is a perspective view illustrating a state that the option device 12 as another embodiment of the invention is mounted on a complex machine as viewed obliquely from the right and rear side. FIG. 14 is a schematic plan view illustrating the inside of the option device 12 and the inside of the complex machine illustrated in FIG. 13. The complex machine is provided with an operation panel 1 including a liquid crystal display device on the right side on the front surface of the main body thereof. A document reading unit 3 including an automatic document feeder (ADF) 2 is provided on the upper portion of the main body. Further the apparatus main body 5 is internally provided with an image forming assembly including a photosensitive drum, an exposure device, a developing device, a transfer device, and a fixing device at a position below the document reading unit 3.

A first exhaust port 8 is formed in the right surface of the apparatus main body 5, and a second exhaust port 9 is formed in the back surface of the apparatus main body 5. An exhaust filter 20 and an exhaust fan (cooling fan) 21 are provided inside the first exhaust port 8. Air (cooling air) that has cooled the fixing device and the like is discharged from the first exhaust port 8 through the exhaust filter 20. Ultrafine particles contained in the cooling air, which may be generated in the developing device and in the fixing device, are trapped by the exhaust filter 20 to some extent, and thereafter, discharged from the first exhaust port 8. An exhaust fan (cooling fan) 22 is provided inside the second exhaust port 9. Air (cooling air) that has cooled the heat generating components such as a power transistor mounted on a power supply substrate is discharged from the second exhaust port 9.

Further, a suction port 10 is formed in a lower portion on the back surface of the apparatus main body 5. Suction ports are formed in the lower surface and in the left surface of the apparatus main body 5, as necessary. After the air sucked through the suction ports cools the inside of the apparatus main body 5 as described above, the air is discharged from the first exhaust port 8 and from the second exhaust port 9.

As described above, the exhaust filter 20 is provided inside the first exhaust port 8. However, since the exhaust filter 20 is a filter having a relatively coarse mesh, it is insufficient to trap ultrafine particles contained in exhaust air (cooling air). Further, the second exhaust port 9 is an exhaust port for discharging cooling air for cooling the heat generating components mounted on a printed substrate, and is not provided with a filter. However, exhaust air from the second exhaust port 9 may include cooling air for cooling the fixing device and the like, and may contain ultrafine particles. In view of the above, the option device (clean unit) 12 in the another embodiment is provided with an auxiliary duct (first duct 41) for guiding exhaust air from the first exhaust port 8 to a duct (main duct) 15 of the main body of the clean unit 12, and an auxiliary duct (second duct 42) for guiding exhaust air from the second exhaust port 9 to the main duct 15.

As well as the clean unit 12 in the embodiment, a HEPA filter 23 and an electric fan 24 are provided inside the main duct 15. Exhaust air collected in the main duct 15 through the first duct 41 and the second duct 42 passes through the HEPA filter 23. After the ultrafine particles in the exhaust air are trapped, the exhaust air is discharged from an exhaust port 16 of the clean unit 12. Note that an air flow sensor 25 for detecting the presence or absence of exhaust air from the complex machine is not disposed in the main duct 15 but is disposed near the second exhaust port 9 in the second duct 42.

As well as the embodiment, the clean unit 12 in the another embodiment is configured such that three small rectangular openings composing an external air inlet port 19 are formed in aside surface of the duct 15 in such a manner that the openings are aligned in a vertical direction (see FIG. 13). A laminate panel (shielding member) PL indicated by the broken line contour is attached to a side surface of the duct 15 in such a manner as to cover the lower two rectangular openings. As well as the embodiment, changing the attaching position of the laminate panel (shielding member) PL makes it possible to change the area (opening area) of the external air inlet port 19. This makes it possible to adjust the air flow resistance in the external air inlet port 19.

In other words, increasing or decreasing the opening area of the external air inlet port 19 makes it possible to increase or decrease the amount of external air to be sucked into the inside of the duct 15, and the suction force by the electric fan 24 in the exhaust ports 8 and 9 of the complex machine varies in inverse proportion to an increase or a decrease in the opening area of the external air inlet port 19. Thus, it is easy to secure balance between the exhaust air flow rate in the exhaust ports 8 and 9 of the complex machine and the suction force by the electric fan 24. Note that it is also possible to apply the modifications including the first to third modifications described on the basis of the embodiment to the clean unit 12 in the another embodiment.

What is claimed as new and desired to be secured by Letters Patent of the United States is:

1. An optional device for an electrical appliance, the optional device being mounted on the electrical appliance, and being provided with a filter for purifying exhaust air from the electrical appliance, and an electric fan, wherein an air flow resistance in an external air inlet port formed independently of a suction port for sucking exhaust air from the electrical appliance is adjustable.

2. The optional device for an electrical appliance according to claim 1, wherein the external air inlet port is formed in a wall surface of a duct forming an air passage from the air suction port to the filter and to the electric fan, and the air flow resistance in the external air inlet port is adjusted by changing an area of the external air inlet port.

3. The optional device for an electrical appliance according to claim 2, further comprising:

an opening which forms the external air inlet port; and a shielding member mounted on the wall surface of the duct in such a manner as to cover a part or an entirety of the opening, wherein the area of the external air inlet port is changed by changing a position of the shielding member.

4. The optional device for an electrical appliance according to claim 1, wherein a plurality of closable openings formed at different positions in a wall surface of a duct forming an air passage from the suction port to the filter and to the electric fan form the external air inlet port, and the air flow resistance in the external air inlet port is adjusted by changing the positions of the openings in an opened state.

5. The optional device for an electrical appliance according to claim 1, further comprising:

an opening which forms the external air inlet port in a wall surface of a duct forming an air passage from the suction port to the filter and to the electric fan, and an air passage changing member which adjusts the air flow resistance in the external air inlet port by changing an external air passage to be guided from the opening into the duct.

6. The optional device for an electrical appliance according to claim 1, wherein a gap is formed between a mounting surface of the optional device which covers an exhaust port of the electrical appliance, and a wall surface of the electrical appliance in which the exhaust port is formed, the gap forms the external air inlet port, and the air flow resistance in the external air inlet port is adjusted by making the gap variable.

7. The option optional device for an electrical appliance according to claim 1, the electrical appliance being provided with an exhaust port, and an exhaust fan which discharges air inside the electrical appliance from the exhaust port, wherein the optional device is mounted with respect to the exhaust port of the electrical appliance.

8. The optional device for an electrical appliance according to claim 1, wherein the electric fan is configured to direct exhaust air through the filter, and is not variably controllable.

* * * * *